(12) United States Patent
Ozawa et al.

(10) Patent No.: US 6,386,466 B1
(45) Date of Patent: May 14, 2002

(54) CLEANING APPARATUS

(75) Inventors: Naritoshi Ozawa; Xiaoming Qiu; Satoshi Ohkawara, all of Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/547,332

(22) Filed: Apr. 11, 2000

(30) Foreign Application Priority Data

Apr. 19, 1999 (JP) .......................... 11-110945

(51) Int. Cl.[7] ................................ B05B 7/04
(52) U.S. Cl. .................... 239/433; 134/198; 261/78.2
(58) Field of Search .................... 239/433, 434; 134/198; 261/78.2

(56) References Cited

U.S. PATENT DOCUMENTS

| | | | | |
|---|---|---|---|---|
| 3,577,808 A | * | 5/1971 | Visser | 261/78.2 |
| 4,666,083 A | * | 5/1987 | Yie | 239/433 X |
| 4,787,404 A | * | 11/1988 | Klosterman et al. | 134/198 |
| 4,815,241 A | * | 3/1989 | Woodson | 239/433 X |
| 5,035,090 A | * | 7/1991 | Szucs | 239/433 X |
| 5,462,605 A | * | 10/1995 | Szucs | 134/198 X |
| 5,918,817 A | * | 7/1999 | Kanno et al. | 239/433 |

* cited by examiner

Primary Examiner—Lesley D. Morris
(74) Attorney, Agent, or Firm—Smith, Gambrell & Russell

(57) ABSTRACT

A cleaning apparatus includes a nozzle having an ejection port, a cleaning liquid path communicating with the ejection port, and a compressed gas path communicating with the ejection port. The cleaning apparatus further includes a cleaning liquid feeding component for feeding a cleaning liquid to the cleaning liquid path, and a compressed gas feeding component for feeding a compressed gas to the compressed gas path. The compressed gas is ejected from the ejection port through the compressed gas path, while the cleaning liquid is ejected from the ejection port through the cleaning liquid path.

7 Claims, 4 Drawing Sheets

CLEANING APPARATUS

FIELD OF THE INVENTION

This invention relates to a cleaning apparatus which jets a cleaning liquid. More specifically, the invention relates to, although not restricted to, a cleaning apparatus particularly suitable for jetting a cleaning liquid at a surface of a workpiece, which has been cut by a cutter such as a semiconductor wafer dicer, to clean the workpiece.

DESCRIPTION OF THE PRIOR ART

As is well known among people skilled in the art, a semiconductor wafer dicer, which cuts a semiconductor wafer along cutting lines arranged in a lattice pattern on the surface of the semiconductor wafer, performs the cutting by causing a rotationally driven, thin, disk-like cutting edge to interfere with the semiconductor wafer, and moving the cutting edge and the semiconductor wafer relative to each other along the cutting lines. With such a dicer, swarf formed by the cutting of the semiconductor wafer adheres to the surface of the semiconductor wafer as contamination. Thus, the dicer is also equipped with a cleaning apparatus for removing the contamination from the surface of the semiconductor wafer. This cleaning apparatus includes nozzle means disposed adjacent the cutting edge, and high pressure cleaning liquid feeding means. The nozzle means has an ejection port, and a high pressure cleaning liquid path communicating with the ejection port. The high pressure cleaning liquid feeding means feeds a cleaning liquid, which may be deionized water, to the high pressure cleaning liquid path of the nozzle means at a high pressure of, for example, 40 to 200 kgf/cm$^2$. Such a cleaning liquid is jetted at a high pressure from the ejection port of the nozzle means toward the surface in an area of the semiconductor wafer which is cut by the cutting edge. By this measure, the surface of the semiconductor wafer is cleaned; that is, the contamination is removed from the surface of the semiconductor wafer.

The foregoing cleaning apparatus poses the following problems to be solved: It is necessary to dispose a relatively bulky and expensive high pressure cleaning liquid feeding means for feeding a cleaning liquid at a considerably high pressure of, for example, 40 to 200 kgf/cm$^2$. It is also necessary that a pipeline between the high pressure cleaning liquid feeding means and the nozzle means be a relatively expensive one resistant to the high pressure cleaning liquid. Thus, not only the apparatus is relatively bulky, but the manufacturing cost for the apparatus is also considerably high.

SUMMARY OF THE INVENTION

A principal object of the present invention is to provide a novel and improved cleaning apparatus which obviates the need to feed a cleaning liquid at a considerably high pressure, and thus is free from the above-described problems facing the conventional cleaning apparatus.

The inventors of the present invention conducted extensive studies and experiments. As a result, they found that if a cleaning liquid is jetted by the action of a compressed gas, nearly the same cleaning effect as obtained by a jet of a considerably high pressure cleaning liquid can be achieved, even when the pressure of the compressed gas is not very high. Even at the pressure of the compressed gas which is much lower than the pressure of the cleaning liquid hitherto employed, a sufficient cleaning effect can be attained. Hence, the cleaning apparatus can be rendered considerably compact and inexpensive compared with the conventional cleaning apparatus. Particularly when the compressed gas is fed at a pressure of 2.7 kgf/cm$^2$ or higher, and ejected through a constriction with an internal diameter of 0.5 to 3.0 mm, the ejection speed of the compressed gas becomes supersonic. When this ejected gas is caused to act on the cleaning liquid, and jetted, together with the cleaning liquid, at an object to be cleaned, there can be achieved substantially the same cleaning effect as when a considerably high pressure cleaning liquid is jetted at an object to be cleaned.

Thus, according to the present invention, there is provided a cleaning apparatus, which attains the aforementioned principal object, comprising:

nozzle means having an ejection port, a cleaning liquid path communicating with the ejection port, and a compressed gas path communicating with the ejection port;

cleaning liquid feeding means for feeding a cleaning liquid to the cleaning liquid path; and compressed gas feeding means for feeding a compressed gas to the compressed gas path, wherein the compressed gas is ejected from the ejection port through the compressed gas path, while the cleaning liquid is ejected from the ejection port through the cleaning liquid path.

Preferably, the compressed gas feeding means feeds the compressed gas to the compressed gas path at a pressure of 2.7 kgf/cm$^2$ or higher, especially a pressure of 2.7 to 6.0 kgf/cm$^2$. In a downstream end portion of the compressed gas path, a constriction is preferably formed. The internal diameter, d, of the constriction is preferably 0.5 to 3.0 mm, especially 1.0 to 2.0 mm. In a referred embodiment, the cleaning liquid path is caused to communicate with the compressed gas path between the constriction and the ejection port, or at the constriction, and is also caused to communicate with the ejection port via the downstream end portion of the compressed gas path. Advantageously, at least a portion of the compressed gas path, ranging from the constriction to the ejection port, extends substantially straightly, and a downstream end portion of the cleaning liquid path extends at an angle of 45 to 90 degrees with the compressed gas path. The cleaning liquid feeding means can feed the cleaning liquid to the cleaning liquid path at a pressure of 1.5 to 2.5 kgf/cm$^2$. The cleaning liquid may be deionized water, and the compressed gas may be compressed air.

DETAILED DESCRIPTION OF THE PREFERRED EMBODIMENTS

Preferred embodiments of a cleaning apparatus constituted in accordance with the present invention will now be described in further detail with reference to the accompanying drawings.

Figure 1:
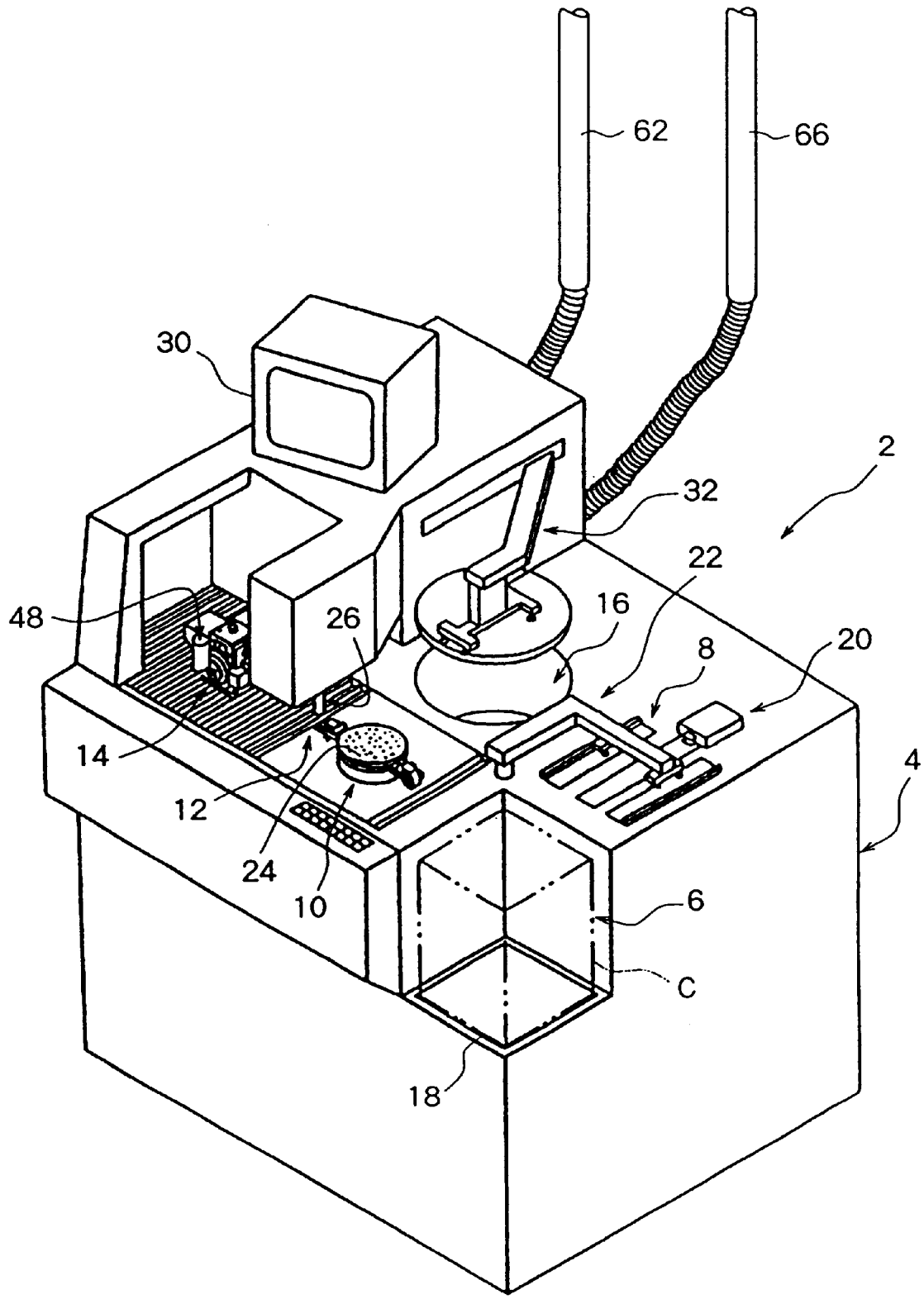
FIG. 1 is a perspective view schematically showing an entire semiconductor wafer dicer equipped with a cleaning apparatus constituted in accordance with the present invention.
Figure 2:
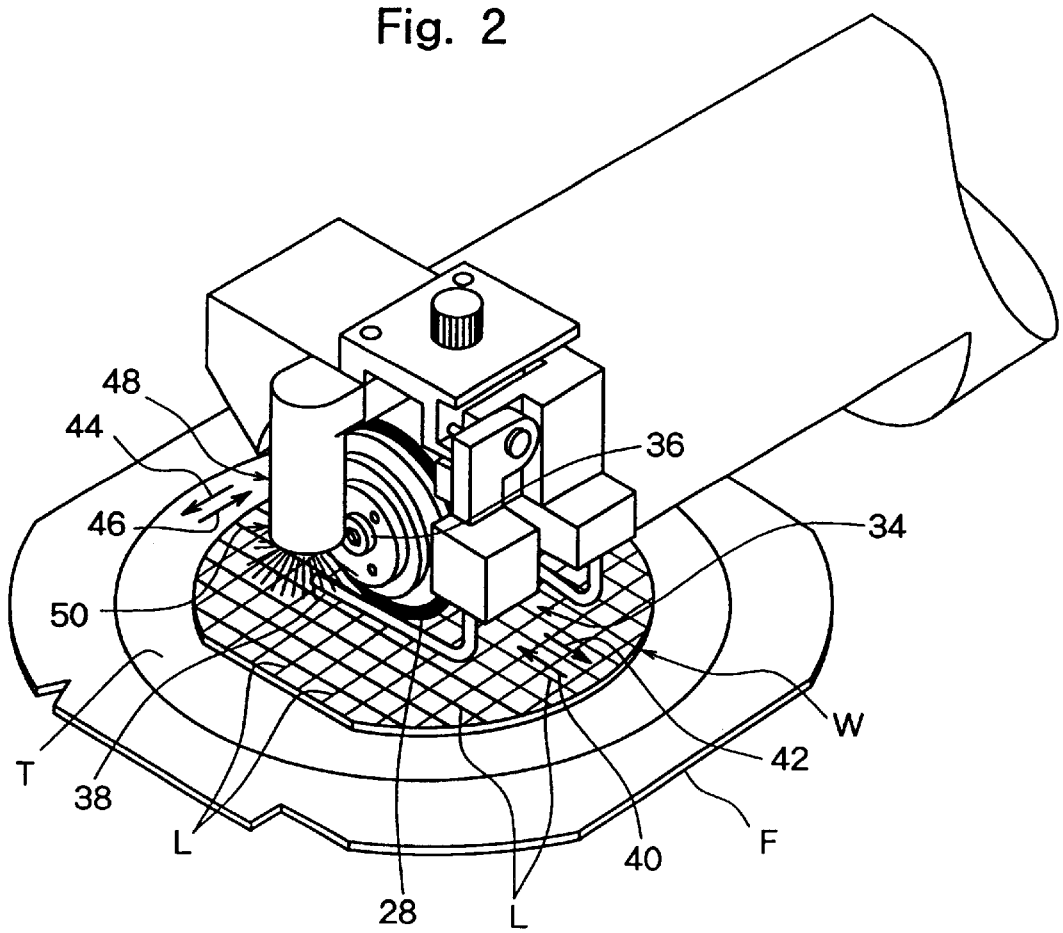
FIG. 2 is a perspective view showing, in an enlarged manner, a part of the semiconductor wafer dicer of FIG. 1.

FIG. 1 shows a semiconductor wafer dicer equipped with a cleaning apparatus constituted in accordance with the invention. A dicer designated entirely as the numeral 2 has a housing 4. On the housing 4, a loading area 6, a waiting area 8, a chucking area 10, an alignment area 12, a cutting area 14, and a final cleaning and drying area 16 are defined. In the charging area 6, a hoisting and lowering table 18 is disposed. On the hoisting and lowering table 18, there is loaded a cassette C in which a plurality of semiconductor wafers W (FIG. 2) are accommodated with spacing in a vertical direction. As shown clearly in FIG. 2, the semiconductor wafer W accommodated in the cassette C is mounted in a central opening of a frame F via a mounting tape T. On a surface of the semiconductor wafer W, cutting lines L are arranged in a lattice pattern. In conjunction with the loading area 6 and the waiting area 8, first transport means 20 is disposed. In accordance with the ascent and descent of the hoisting and lowering table 18, the first transport means 20 is actuated to deliver the frame F, on which the semiconductor wafer W to be cut is mounted, sequentially from the cassette C to the waiting area 8 (and, as will be further mentioned later on, to bring the frame F, on which the semiconductor wafer W having been cut, finally cleaned and dried is mounted, from the waiting area 8 into the cassette C). In conjunction with the waiting area 8, the chucking area 10, and the final cleaning and drying area 16, second transport means 22 is disposed. The frame F delivered from the cassette C to the waiting area 8 is transported to the chucking area 10 by the second transport means 22. In the chucking area 10, the frame F, on which the semiconductor wafer W to be cut is mounted, is vacuum attracted onto a chuck 24 having a circular surface. The frame F attracted onto the chuck 24 in the chucking area 10 is moved in accordance with the movement of the chuck 24, and positioned in the alignment area 12. In conjunction with the alignment area 12, imaging means 26 is disposed. The surface of the semiconductor wafer W mounted on the frame F is imaged by the imaging means 26. Based on the resulting image, the chuck 24 (accordingly, the frame F having the semiconductor wafer W mounted thereon) is precisely positioned so that the cutting lines L arranged on the surface of the semiconductor wafer W will rest on a required relative position with respect to a cutting edge 28 disposed in conjunction with the cutting area 14. The surface of the semiconductor wafer W imaged by the imaging means 26 is displayed on a monitor 30. Then, the chuck 24 is moved to the cutting area 14, where the semiconductor wafer W mounted on the frame F is cut along the cutting lines L. In FIG. 2, the cutting line L that was already cut is indicated as a thick solid line, while the cutting line L that has not been cut is indicated as a thin solid line. This cutting is carried out such that at least the mounting tape T is uncut, while the semiconductor wafer W usually is not cut completely, but a portion thereof facing downward is left uncut. Hence, even after cutting of the semiconductor wafer W, the semiconductor wafer W continues to be mounted on the frame F via the mounting tape T.

After the semiconductor wafer W is cut as required in the cutting area 14, the frame F is returned to the chucking area 10 in accordance with the movement of the chuck 24. In conjunction with the chucking area 10 and the final cleaning and drying area 16, third transport means 32 is disposed. By this third transport means 32, the frame F is transported to the final cleaning and drying area 16. In the final cleaning and drying area 16, the cut semiconductor wafer W is finally cleaned and dried by cleaning and drying means (not shown). Then, the frame F is returned to the waiting area 8 by the second transport means 22, and returned to the cassette C by the first transport means 20.

Referring to FIG. 2 along with FIG. 1, cutting means 34 including the cutting edge 28 is disposed in the cutting area 14. The cutting means 34 has a rotatably mounted rotating shaft 36, and the cutting edge 28 is fixed to a front end portion of the rotating shaft 36. The cutting edge 28 may be a thin, circular one containing numerous diamond particles. Adjacent to the cutting edge 28, a cooling liquid jetting nozzle 38 is disposed. In the cooling liquid jetting nozzle 38, a plurality of jetting holes (not shown) directed toward the cutting edge 28 are formed. In cutting the semiconductor wafer W, the rotating shaft 36 is rotationally driven, and the chuck 24 having attracted thereto the frame F, on which the semiconductor wafer W is mounted, is continuously moved, for cutting, in directions shown by arrows 40 and 42 in FIG. 2. Between a cutting movement and a subsequent cutting movement, the chuck 24 is moved, for indexing, in a direction shown by an arrow 44 or 46, whereby each of the cutting lines L is sequentially aligned with the cutting edge 28. Upon completion of cutting along the cutting lines L extending in a predetermined direction, the chuck 24 is rotated through an angle of 90 degrees, whereafter cutting along the cutting lines L extending perpendicularly to the cutting lines L extending in the predetermined direction is performed likewise. In this manner, the semiconductor wafer W is cut along the cutting lines L arranged in the lattice pattern. When cutting of the semiconductor wafer W is performed by the cutting edge 28, a cooling liquid which may be deionized water is jetted from the jetting holes of the cooling liquid jetting nozzle 38 toward the cutting edge 28. The dicer 2 also has a cleaning apparatus 48, which includes nozzle means 50 disposed adjacent to and forward of the cutting edge 28. From the nozzle means 50 of the cleaning apparatus 48, a cleaning liquid is jetted toward the area in the semiconductor wafer W, where cutting was already performed, to remove swarf from the surface of the semiconductor wafer W.

Constitutions other than the cleaning apparatus 48 in the illustrated dicer 2 may be in a suitable form well known among people skilled in the art, and do not constitute a part of the invention. Thus, an explanation for their details will be omitted herein.

Figure 3:
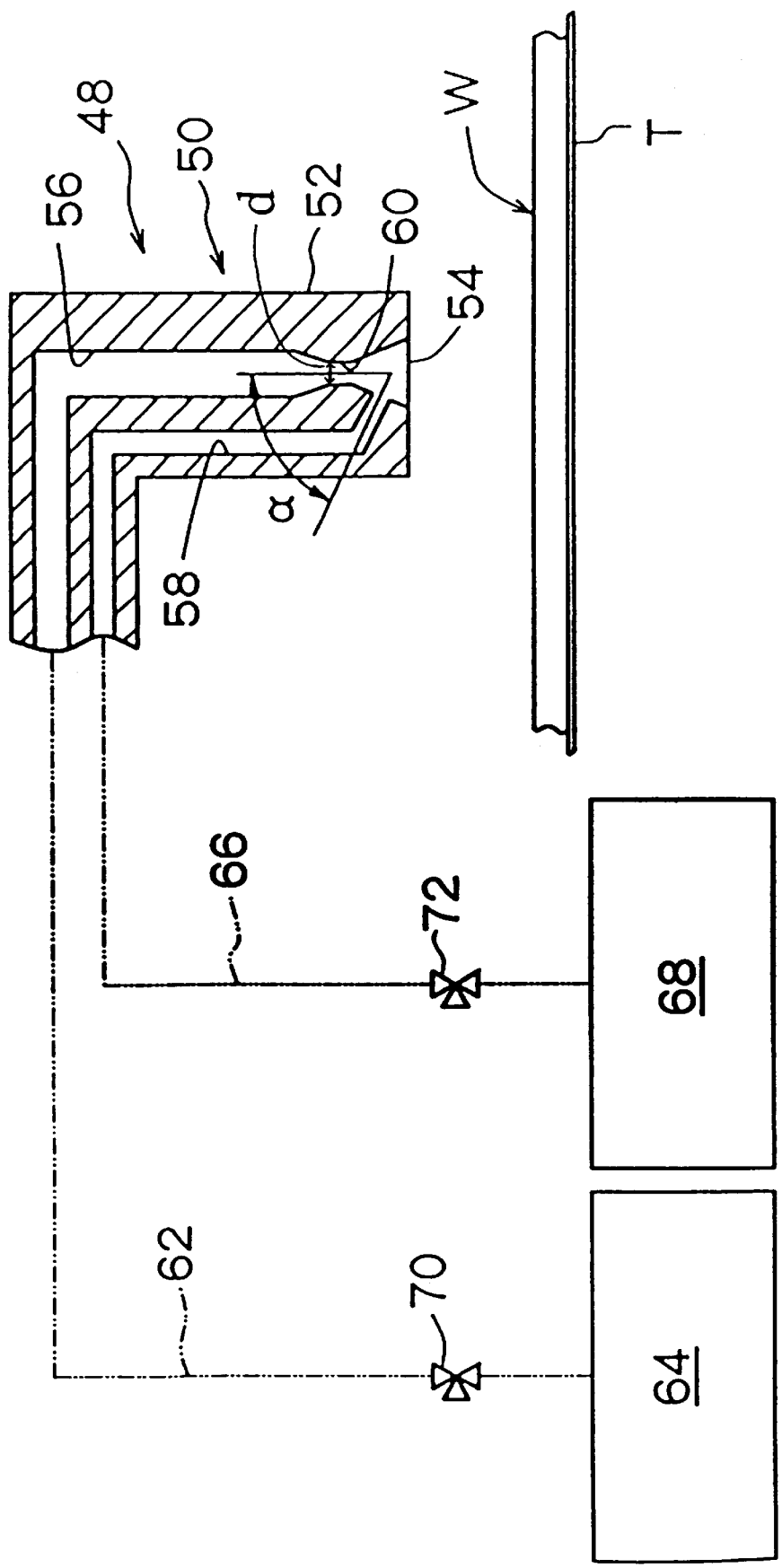
FIG. 3 is a sectional view showing nozzle means provided in the semiconductor wafer dicer of FIG. 1.

Referring to FIG. 3 along with FIG. 2, a main portion 52 of the nozzle means 50 of the cleaning apparatus 48 is disposed substantially vertically, and is positioned substantially perpendicularly to the semiconductor wafer W located in the cutting area 14. In a front end face, i.e., a lower end face, of the nozzle means 50, an ejection port 54 is formed. In the nozzle means 50, not only a compressed gas path 56 communicating with the ejection port 54, but also a cleaning liquid path 58 communicating with the ejection port 54 is formed. The compressed gas path 56 extends substantially vertically as far as the ejection port 54 in the main portion 52 of the nozzle means 50. In a downstream end portion of the compressed gas path 56, a constriction 60 is formed. Upstream from the constriction 60, the internal diameter of the compressed gas path 56 is gradually decreased toward a downstream side. Downstream from the constriction 60, the internal diameter of the compressed gas path 56 is gradually increased. The internal diameter, d, of the constriction 60 is preferably 0.5 to 3.0 mm, especially 1.0 to 2.0 mm. The cleaning liquid path 58, on the other hand, extends parallel to the compressed gas path 56 in the main portion 52 of the nozzle means 50, then extends at an angle, α, to the compressed gas path 56, and is connected to the compressed gas path 56 downstream from the constriction 60. Thus, the cleaning liquid path 58 is caused to communicate with the ejection port 54 via the downstream end portion of the compressed gas path 56. The angle a which α downstream end portion of the cleaning liquid path 58 makes with the compressed gas path 56 is preferably about 45 to 90 degrees.

To the compressed gas path 56, compressed gas feeding means 64 is connected via a pipeline 62. To the cleaning liquid path 58, cleaning liquid feeding means 68 is connected via a pipeline 66 (the cooling liquid jetted from the cooling liquid jetting nozzle 38 can also be fed from the cleaning liquid feeding means 68). In the pipeline 62, an opening and closing control valve 70 is disposed. In the pipeline 66, an opening and closing control valve 72 is disposed. The compressed gas feeding means 64 feeds a compressed gas, which may be compressed air, preferably at a pressure of 2.7 kgf/cm$^2$ or higher, especially at a pressure of 2.7 to 6.0 kgf/cm$^2$, to the compressed gas path 56 via the pipeline 62. The cleaning liquid feeding means 68 feeds a cleaning liquid, which may be deionized water, preferably at a pressure of 1.5 to 2.5 kgf/cm$^2$, to the cleaning liquid path 58 via the pipeline 66. In cleaning the cut area of the semiconductor wafer W, the cleaning liquid is fed from the cleaning liquid feeding means 68 to the cleaning liquid path 58, while the compressed gas is fed from the compressed gas feeding means 64 to the compressed gas path 56, whereupon the cleaning liquid and the compressed gas are ejected together from the ejection port 54. The cleaning liquid caused to flow from the cleaning liquid path 58 to the downstream end portion of the compressed gas path 56 is accelerated by the compressed gas ejected from the ejection port 54 through the constriction 60, and jetted from the ejection port 54. A jet of the cleaning liquid strikes the surface of the semiconductor wafer W to clean the surface of the semiconductor wafer W effectively. According to the inventors' experience, when the compressed gas is fed, particularly, at a pressure of 2.7 kgf/cm$^2$ or higher, and ejected through the constriction 60 with an internal diameter of 0.5 to 3.0 mm, especially 1.0 to 2.0 mm, the ejection speed of the compressed gas becomes supersonic, and can make the cleaning effect fully satisfactory. To achieve a satisfactory cleaning effect, the pressure of the compressed gas need not be excessively high, but may be about 2.7 to 6.0 kgf/cm$^2$.

Figure 4:
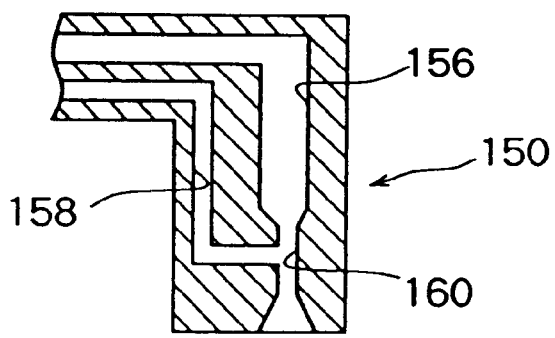
FIG. 4 is a sectional view showing a modification of the nozzle means.

FIG. 4 shows a modification of the nozzle means. In nozzle means 150 illustrated in FIG. 4, a constriction 160 formed in a compressed gas path 156 is relatively long, and a downstream end portion of a cleaning liquid path 158 extends substantially perpendicularly to the compressed gas path 156, and is connected to the constriction 160. Other constitutions of the nozzle means 150 are substantially the same as in the nozzle means 50 illustrated in FIG. 3.

EXAMPLES AND COMPARATIVE EXAMPLES

Examples 1 to 6

Figure 5:
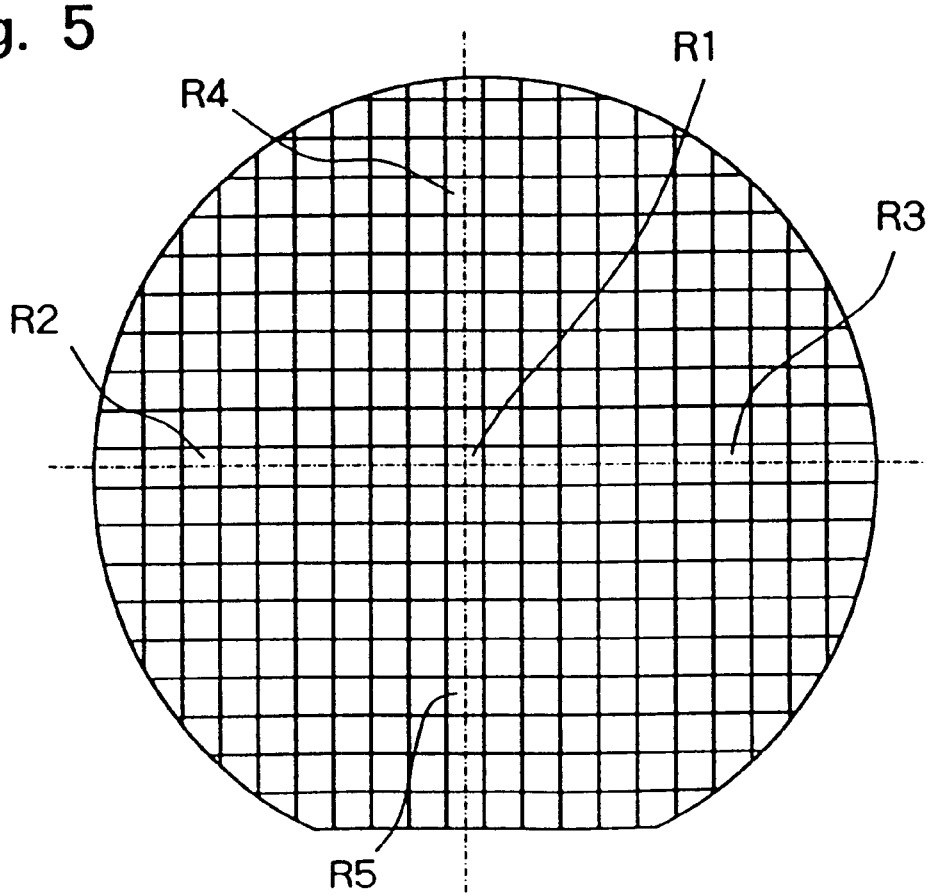
FIG. 5 is a plan view showing contamination removal rate measurement regions on a surface of a semiconductor wafer in each of Examples and Comparative Examples.

A dicer sold under the trade name "DFD640" by Disco Corporation (Tokyo, Japan) was used, with its cleaning apparatus being changed to a cleaning apparatus of a shape as illustrated in FIGS. 1 to 3 (such a dicer had a shape as shown in FIGS. 1 to 3). A semiconductor wafer mounted on a frame via a mounting tape was brought into the dicer to cut the semiconductor wafer in a lattice form. The semiconductor wafer was a silicon wafer of a shape as shown in FIG. 5, and having a diameter D of 150 mm, an orientation flat length L of 50 mm, and a thickness TH of 0.5 mm. The surface of the semiconductor wafer was in a mirror polished state.

Prior to cutting of the semiconductor wafer, the surface of the semiconductor wafer was imaged by an imaging device. The resulting image was measured for the lightness of each of five regions R1, R2, R3, R4 and R5 on the surface of the semiconductor wafer. The semiconductor wafer was to be cut by a subsequent cutting operation along 20 lateral cutting lines LL and 20 vertical cutting lines LV shown in FIG. 5. Each of the regions R1, R2, R3, R4 and R5 is a region surrounded by the lateral cutting lines LL and the vertical cutting lines LV. The lightness of each region was determined by measuring the lightness of each of 512×480 pixels in each region on a 64-level gradation scale (level 1 represents white, and level 64 black), and calculating the total value of lightness of all pixels in each region. The average value of lightness for the five regions was found to be 200×10$^4$. This fact means that the average lightness of the surface of the semiconductor wafer having no swarf is 200×10$^4$.

Then, the semiconductor wafer was cut (more specifically, cut to a depth of 0.5 mm from the surface) along 20 lateral cutting lines LL arranged with equal spacing (7 mm) and 20 vertical cutting lines LV arranged with equal spacing (7 mm). The average lightness of the surface of the semiconductor wafer after cutting was determined by the above-described method.

Furthermore, the surface of the semiconductor wafer after cutting was cleaned by the cleaning apparatus, and then the average lightness of the surface of the semiconductor wafer was determined. The internal diameter of a constriction in a compressed gas path of nozzle means was 0.5 mm. The compressed gas path was fed with compressed air at a pressure as described in Table 1 below.

A cleaning liquid path was fed with 140 cc/min of deionized water at a pressure of 2.0 kgf/cm$^2$. During cleaning, a chuck (accordingly, the semiconductor wafer) was moved at a speed of 30 mm/second relative to the nozzle means. The cleaning rate was calculated from the equation:

Cleaning rate={[(average lightness before cleaning−200×10$^4$)−(average lightness after cleaning−200×10$^4$)]/(average lightness before cleaning−200×10$^4$)}×100

The results are shown in Table 1.

TABLE 1

| | Air pressure (kgf/cm$^2$) | Average lightness before cleaning | Average lightness after cleaning | Cleaning rate (%) |
|---|---|---|---|---|
| Ex.1 | 2.5 | 558 × 10$^4$ | 433 × 10$^4$ | 35 |
| Ex.2 | 2.7 | 563 × 10$^4$ | 399 × 10$^4$ | 45 |
| Ex.3 | 3.0 | 559 × 10$^4$ | 387 × 10$^4$ | 48 |
| Ex.4 | 4.0 | 553 × 10$^4$ | 378 × 10$^4$ | 50 |
| Ex.5 | 5.0 | 559 × 10$^4$ | 368 × 10$^4$ | 53 |
| Ex.6 | 6.0 | 561 × 10$^4$ | 344 × 10$^4$ | 60 |

Examples 7 to 12

The cleaning rate was determined in the same manner as in Examples 1 to 6, except that the internal diameter of the constriction in the compressed gas path of the nozzle means was 1.1 mm. The results are shown in Table 2.

TABLE 2

| | Air pressure (kgf/cm$^2$) | Average lightness before cleaning | Average lightness after cleaning | Cleaning rate (%) |
|---|---|---|---|---|
| Ex.7 | 2.5 | 558 × 10$^4$ | 367 × 10$^4$ | 53 |
| Ex.8 | 2.7 | 565 × 10$^4$ | 328 × 10$^4$ | 65 |
| Ex.9 | 3.0 | 554 × 10$^4$ | 316 × 10$^4$ | 67 |
| Ex.10 | 4.0 | 557 × 10$^4$ | 276 × 10$^4$ | 79 |
| Ex.11 | 5.0 | 553 × 10$^4$ | 275 × 10$^4$ | 79 |
| Ex.12 | 6.0 | 564 × 10$^4$ | 253 × 10$^4$ | 85 |

Examples 13 to 18

The cleaning rate was determined in the same manner as in Examples 1 to 6, except that the internal diameter of the constriction in the compressed gas path of the nozzle means was 1.4 mm. The results are shown in Table 3.

TABLE 3

| | Air pressure (kgf/cm$^2$) | Average lightness before cleaning | Average lightness after cleaning | Cleaning rate (%) |
|---|---|---|---|---|
| Ex.13 | 2.5 | 552 × 10$^4$ | 355 × 10$^4$ | 56 |
| Ex.14 | 2.7 | 561 × 10$^4$ | 289 × 10$^4$ | 75 |
| Ex.15 | 3.0 | 558 × 10$^4$ | 276 × 10$^4$ | 79 |
| Ex.16 | 4.0 | 559 × 10$^4$ | 241 × 10$^4$ | 88 |
| Ex.17 | 5.0 | 563 × 10$^4$ | 217 × 10$^4$ | 95 |
| Ex.18 | 6.0 | 554 × 10$^4$ | 216 × 10$^4$ | 95 |

Examples 19 to 24

The cleaning rate was determined in the same manner as in Examples 1 to 6, except that the internal diameter of the constriction in the compressed gas path of the nozzle means was 1.8 mm. The results are shown in Table 4.

TABLE 4

| | Air pressure (kgf/cm$^2$) | Average lightness before cleaning | Average lightness after cleaning | Cleaning rate (%) |
|---|---|---|---|---|
| Ex.19 | 2.5 | 556 × 10$^4$ | 351 × 10$^4$ | 57 |
| Ex.20 | 2.7 | 551 × 10$^4$ | 277 × 10$^4$ | 78 |
| Ex.21 | 3.0 | 555 × 10$^4$ | 266 × 10$^4$ | 81 |
| Ex.22 | 4.0 | 569 × 10$^4$ | 230 × 10$^4$ | 92 |
| Ex.23 | 5.0 | 566 × 10$^4$ | 217 × 10$^4$ | 95 |
| Ex.24 | 6.0 | 558 × 10$^4$ | 217 × 10$^4$ | 95 |

Examples 25 to 30

The cleaning rate was determined in the same manner as in Examples 1 to 6, except that the internal diameter of the constriction in the compressed gas path of the nozzle means was 3.0 mm. The results are shown in Table 5.

TABLE 5

| | Air pressure (kgf/cm$^2$) | Average lightness before cleaning | Average lightness after cleaning | Cleaning rate (%) |
|---|---|---|---|---|
| Ex.25 | 2.5 | 569 × 10$^4$ | 366 × 10$^4$ | 55 |
| Ex.26 | 2.7 | 556 × 10$^4$ | 286 × 10$^4$ | 76 |
| Ex.27 | 3.0 | 553 × 10$^4$ | 274 × 10$^4$ | 79 |
| Ex.28 | 4.0 | 557 × 10$^4$ | 241 × 10$^4$ | 88 |

TABLE 5-continued

| | Air pressure (kgf/cm$^2$) | Average lightness before cleaning | Average lightness after cleaning | Cleaning rate (%) |
|---|---|---|---|---|
| Ex.29 | 5.0 | 561 × 10$^4$ | 234 × 10$^4$ | 90 |
| Ex.30 | 6.0 | 559 × 10$^4$ | 222 × 10$^4$ | 94 |

Comparative Examples 1 to 3

For purposes of comparison, the cleaning rate was determined in the same manner as in Example 1, except that only the cleaning liquid path with an internal diameter of 0.1 mm was formed in the nozzle means of the cleaning apparatus, and that the nozzle means was fed with 3,500 cc/min of deionized water at a pressure as described in Table 6. The results are shown in Table 6.

TABLE 6

| | Cleaning liquid pressure (kgf/cm$^2$) | Average lightness before cleaning | Average lightness after cleaning | Cleaning rate (%) |
|---|---|---|---|---|
| Comp. Ex.1 | 100 | 558 × 10$^4$ | 286 × 10$^4$ | 76 |
| Comp. Ex.2 | 150 | 565 × 10$^4$ | 237 × 10$^4$ | 90 |
| Comp. Ex.3 | 200 | 554 × 10$^4$ | 217 × 10$^4$ | 95 |

From the foregoing Examples and Comparative Examples, it is understood that the cleaning apparatus of the present invention can achieve the same cleaning effect as the cleaning effect of the conventional cleaning apparatus which fed a cleaning liquid at a considerably high pressure, even when the pressure of the compressed gas fed and the pressure of the cleaning liquid fed are much lower than the pressure of the cleaning liquid in the conventional cleaning apparatus.

What we claim is:

1. A cleaning apparatus comprising:

nozzle means having an ejection port, a cleaning liquid path communicating with the ejection port, and a compressed gas path communicating with the ejection port, wherein a constriction is formed in a downstream end portion of the compressed gas path and the cleaning liquid path is caused to communicate with the compressed gas path between the constriction and the ejection port, or at the constriction, and is also caused to communicate with the ejection port via the downstream end portion of the compressed gas path;

cleaning liquid feeding means for feeding a cleaning liquid to the cleaning liquid path, wherein the cleaning liquid feeding means feeds the cleaning liquid to the cleaning liquid path at a pressure of 1.5 to 2.5 kgfcm$^2$; and compressed gas feeding means for feeding a compressed gas to the compressed gas path, wherein the compressed gas feeding means feeds the compressed gas to the compressed gas path at a pressure of 2.7 kgfcm$^2$ or higher, and wherein the compressed gas is ejected from the ejection port through the compressed gas path, while the cleaning liquid is ejected from the ejection port through the cleaning liquid path.

2. The cleaning apparatus of claim 1, wherein the compressed gas feeding means feeds the compressed gas to the compressed gas path at a pressure of 2.7 kgfcm$^2$ to 6.0 kgf/cm$^2$.

3. The cleaning apparatus of claim 1, wherein an internal diameter, d, of the constriction is 0.5 to 3.0 mm.

4. The cleaning apparatus of claim 3, wherein the internal diameter, d, of the constriction is 1.0 to 2.0 mm.

5. The cleaning apparatus of claim 1, wherein at least a portion of the compressed gas path, ranging from the constriction to the ejection port, extends substantially straightly, and a downstream end portion of the cleaning liquid path extends at an angle of 45 to 90 degrees with the compressed gas path.

6. The cleaning apparatus of claim 1, wherein the cleaning liquid is deionized water.

7. The cleaning apparatus of claim 1, wherein the compressed gas is compressed air.

* * * * *